(12) United States Patent
Ehrenpfordt et al.

(10) Patent No.: US 10,775,407 B2
(45) Date of Patent: Sep. 15, 2020

(54) SENSOR SYSTEM AND COVER DEVICE FOR A SENSOR SYSTEM

(71) Applicant: Robert Bosch GmbH, Stuttgart (DE)

(72) Inventors: Ricardo Ehrenpfordt, Korntal-Muenchingen (DE); Frederik Ante, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 1446 days.

(21) Appl. No.: 14/135,244

(22) Filed: Dec. 19, 2013

(65) Prior Publication Data

US 2014/0184263 A1 Jul. 3, 2014

(30) Foreign Application Priority Data

Dec. 27, 2012 (DE) ................. 10 2012 224 424

(51) Int. Cl.
| | |
|---|---|
| *G01R 1/02* | (2006.01) |
| *G01D 11/24* | (2006.01) |
| *G01R 31/28* | (2006.01) |
| *H01L 23/00* | (2006.01) |

(52) U.S. Cl.
CPC ............. *G01R 1/02* (2013.01); *G01D 11/245* (2013.01); *G01R 31/2884* (2013.01); *H01L 24/48* (2013.01); *H01L 24/49* (2013.01); *H01L 2224/48091* (2013.01); *H01L 2224/48137* (2013.01); *H01L 2224/48227* (2013.01); *H01L 2224/48472* (2013.01); *H01L 2224/49109* (2013.01); *H01L 2924/00014* (2013.01); *H01L 2924/12042* (2013.01); *H01L 2924/15183* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 5,629,538 A | * | 5/1997 | Lipphardt | G01L 9/0042 257/254 |
| 5,917,165 A | * | 6/1999 | Platt | H03K 17/962 200/511 |
| 5,973,417 A | * | 10/1999 | Goetz | H03K 17/962 307/116 |
| 6,369,435 B1 | * | 4/2002 | Igel | G01L 19/142 257/415 |

(Continued)

FOREIGN PATENT DOCUMENTS

| | | |
|---|---|---|
| CN | 101667548 A | 3/2010 |
| CN | 101726343 A | 6/2010 |

(Continued)

*Primary Examiner* — Patrick Assouad
*Assistant Examiner* — Suresh K Rajaputra
(74) *Attorney, Agent, or Firm* — Maginot, Moore & Beck LLP

(57) ABSTRACT

A sensor system includes a sensor device and a cover device. The sensor device includes an external surface on which at least one electrical test contact is arranged. The cover device includes at least partially an electrically insulating material and is mechanically connected to the sensor device. The cover device is configured to cover the at least one electrical test contact of the sensor device so as to prevent contact from being made to the at least one electrical test contact from outside the sensor system.

16 Claims, 16 Drawing Sheets

(56) References Cited

U.S. PATENT DOCUMENTS

| | | | | |
|---|---|---|---|---|
| 6,413,474 B1* | 7/2002 | Igel | | G01L 19/147 |
| | | | | 204/403.06 |
| 7,001,191 B2* | 2/2006 | Nishizawa | | C08L 83/04 |
| | | | | 439/90 |
| 7,213,465 B2* | 5/2007 | Benzel | | B81C 1/00246 |
| | | | | 374/E7.036 |
| 7,268,435 B2* | 9/2007 | Ohta | | B81C 1/00238 |
| | | | | 257/686 |
| 7,275,424 B2* | 10/2007 | Felton | | B81B 7/007 |
| | | | | 257/678 |
| 7,335,971 B2* | 2/2008 | Funk | | G01P 1/023 |
| | | | | 257/686 |
| 7,357,017 B2* | 4/2008 | Felton | | B81B 7/007 |
| | | | | 257/678 |
| 7,449,366 B2* | 11/2008 | Lee | | B81C 1/00301 |
| | | | | 257/704 |
| 7,518,234 B1* | 4/2009 | Okojie | | B81B 7/0061 |
| | | | | 257/710 |
| 7,635,606 B2* | 12/2009 | Warren | | B81C 1/00333 |
| | | | | 257/E23.022 |
| 7,726,976 B2* | 6/2010 | Mason | | H05K 7/1061 |
| | | | | 439/66 |
| 7,793,550 B2* | 9/2010 | Elian | | B81B 7/0048 |
| | | | | 73/754 |
| 7,838,328 B2* | 11/2010 | Isa | | H01L 27/1214 |
| | | | | 257/E21.211 |
| 7,859,093 B2* | 12/2010 | Funk | | G01P 1/023 |
| | | | | 257/414 |
| 8,080,819 B2* | 12/2011 | Mueller | | F21K 9/00 |
| | | | | 257/13 |
| 8,129,838 B2* | 3/2012 | Reinert | | B81B 7/007 |
| | | | | 257/685 |
| 8,220,337 B2* | 7/2012 | Has | | G01L 9/0072 |
| | | | | 257/415 |
| 8,324,728 B2* | 12/2012 | Tabrizi | | H01L 23/055 |
| | | | | 257/704 |
| 8,329,555 B2* | 12/2012 | Reichenbach | | B81C 1/00301 |
| | | | | 257/680 |
| 8,477,029 B2* | 7/2013 | Ashrafzadeh | | G06Q 10/087 |
| | | | | 340/540 |
| 8,680,665 B2* | 3/2014 | Rothacher | | B81B 7/0041 |
| | | | | 257/415 |
| 8,861,218 B2* | 10/2014 | Smith | | B81B 7/04 |
| | | | | 361/760 |
| 8,900,931 B2* | 12/2014 | Liang | | B81B 7/0077 |
| | | | | 257/737 |
| 8,987,921 B2* | 3/2015 | Scholz | | H01L 21/561 |
| | | | | 257/787 |
| 2003/0065472 A1* | 4/2003 | Eckel | | H05B 37/02 |
| | | | | 702/130 |
| 2005/0009316 A1* | 1/2005 | Franosch | | B81C 1/00333 |
| | | | | 438/613 |
| 2005/0262929 A1 | 12/2005 | Felton et al. | | |
| 2009/0108382 A1* | 4/2009 | Eriksen | | C23C 14/021 |
| | | | | 257/419 |
| 2009/0230982 A1 | 9/2009 | Hirakawa et al. | | |
| 2010/0097080 A1* | 4/2010 | Kobayashi | | G06K 9/00053 |
| | | | | 324/692 |
| 2010/0242605 A1* | 9/2010 | Offterdinger | | B81B 7/0058 |
| | | | | 73/514.38 |
| 2012/0106085 A1* | 5/2012 | Yamazaki | | G01J 5/029 |
| | | | | 361/705 |
| 2012/0106112 A1* | 5/2012 | Knies | | H05K 3/403 |
| | | | | 361/783 |
| 2012/0261774 A1* | 10/2012 | Graham | | B81B 7/007 |
| | | | | 257/415 |
| 2013/0193530 A1* | 8/2013 | Ehrenpfordt | | B81B 7/0048 |
| | | | | 257/415 |
| 2013/0255750 A1* | 10/2013 | Escher | | H01L 31/0521 |
| | | | | 136/246 |
| 2013/0255752 A1* | 10/2013 | Escher | | H01L 31/0583 |
| | | | | 136/248 |
| 2013/0255753 A1* | 10/2013 | Escher | | H01L 31/0586 |
| | | | | 136/248 |
| 2013/0328416 A1* | 12/2013 | Whitworth | | F03G 7/08 |
| | | | | 307/149 |
| 2014/0056028 A1* | 2/2014 | Nichol | | G02B 6/0028 |
| | | | | 362/611 |

FOREIGN PATENT DOCUMENTS

| | | |
|---|---|---|
| CN | 101852811 A | 10/2010 |
| DE | 10 2008 005 520 A1 | 7/2009 |
| DE | 10 2008 064 047 A1 | 4/2010 |
| JP | 2012-47451 A | 3/2012 |
| WO | 2008/075401 A1 | 6/2008 |
| WO | 2009/048863 A1 | 4/2009 |
| WO | 2012/122511 A1 | 9/2012 |

* cited by examiner

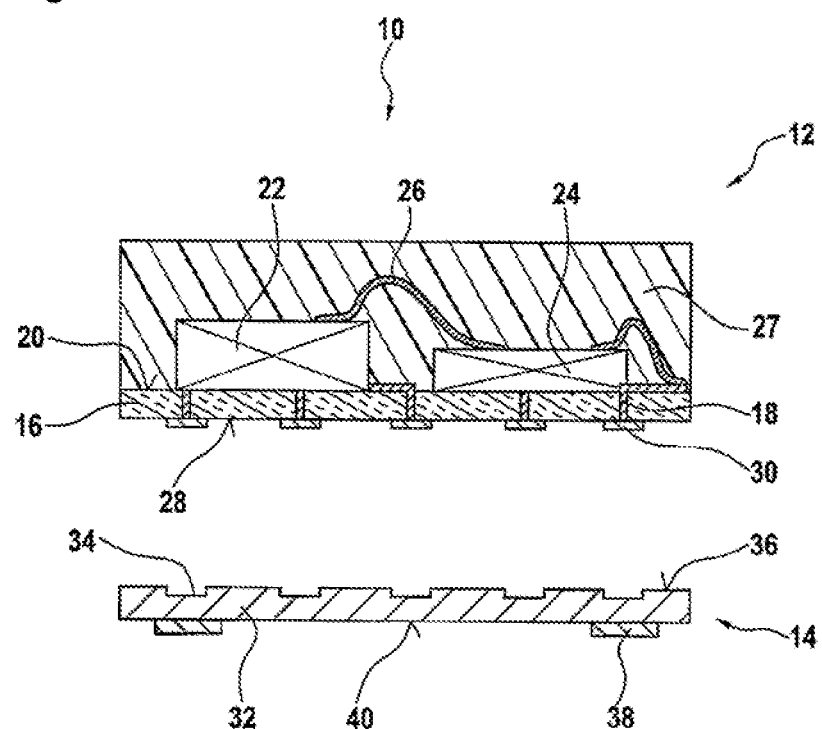

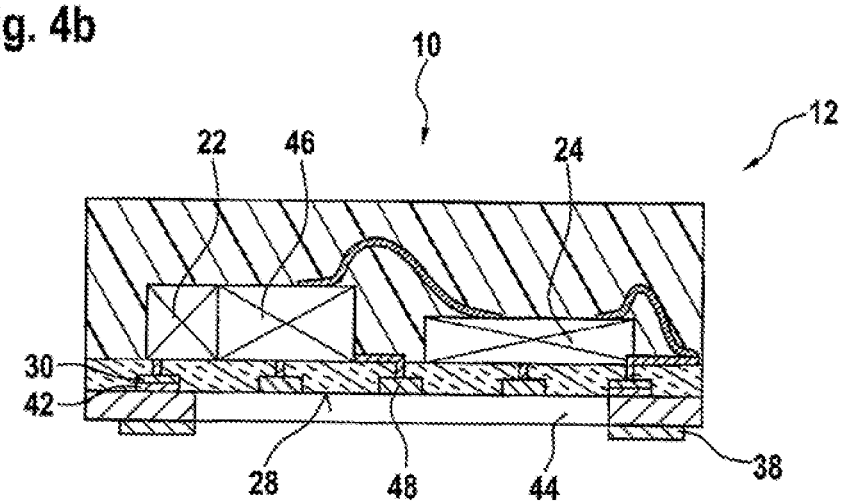
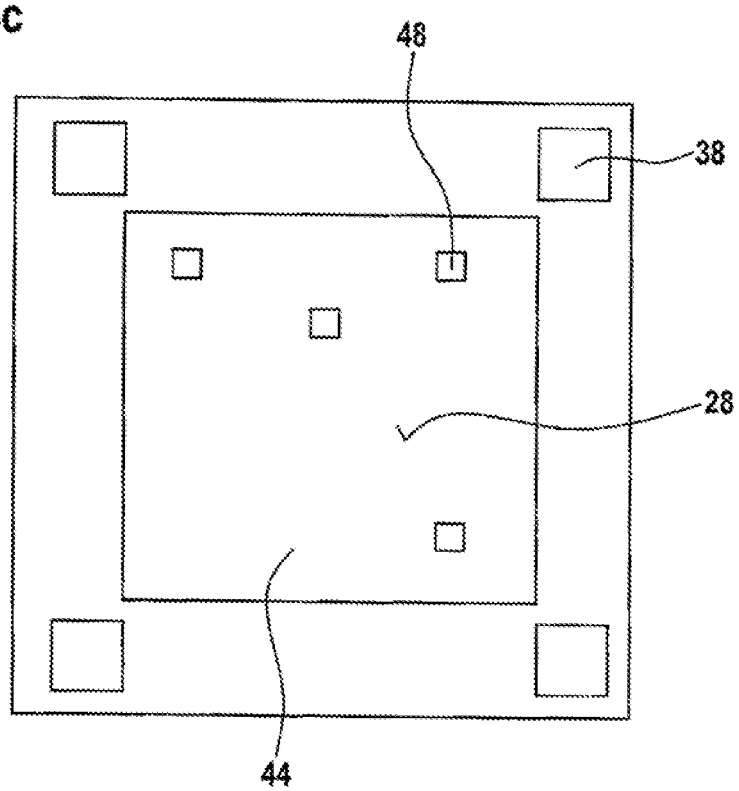

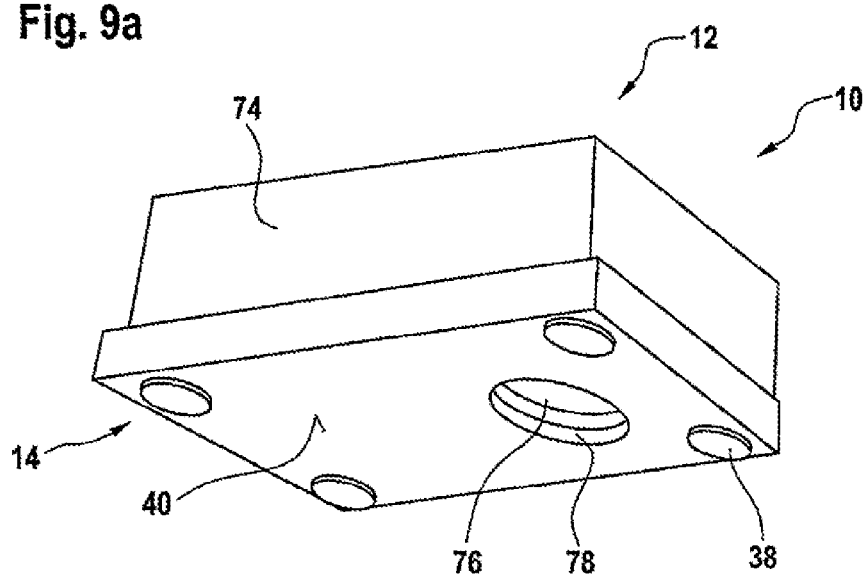
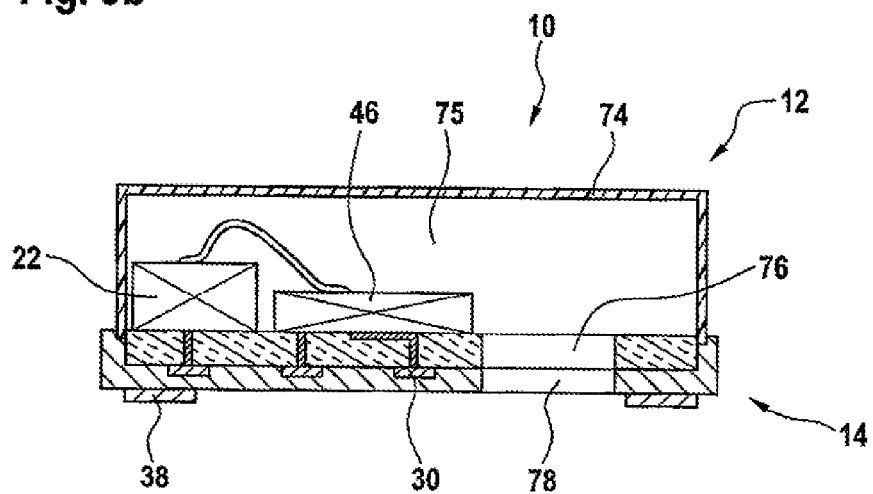

SENSOR SYSTEM AND COVER DEVICE FOR A SENSOR SYSTEM

This application claims priority under 35 U.S.C. § 119 to patent application no. DE 10 2012 224 424.7, filed on Dec. 17, 2012 in Germany, the disclosure of which is incorporated herein by reference in its entirety.

BACKGROUND

The present disclosure relates to a sensor system and to a cover device for a sensor system.

Multichip packages (without dedicated software control) are the current prior art and are integrated e.g. in smartphones. These sensors (multichip packages or individual systems), however, always have electrical contacts to the outside at which the sensors can be tested and calibrated once they have been made (yet before they are fitted in a smartphone). Then the sensors are solder-mounted in the smartphone on these electrical contacts.

For production reasons, autonomous sensor systems always have electrical contacts for testing and calibration on at least one side of the package. The end user has direct access to these contacts.

SUMMARY

Against this background, the present disclosure presents a sensor system and a cover device for a sensor system according to the description below. The following description contain advantageous embodiments.

The sensor system according to the disclosure has the advantage that the electrical contacts, which for production reasons for functionality testing during or after finishing a sensor device, cannot be accessed, or contact cannot be made with said contacts, from outside the sensor system. In other words, this means that by providing on a sensor device the cover substrate embodied according to the disclosure, the electrical test contacts of the sensor device, and hence the sensor device or the whole sensor system, are protected from access by the end user in a very simple and cost-effective manner, thereby preventing unauthorized tampering with the whole system. In addition, the cover substrate according to the disclosure also protects the integrated electronics from short-circuits e.g. resulting from moisture (condensation). In the case of energy-autonomous sensor systems, for instance comprising built-in energy harvesters, which constantly produce power, the cover substrate also protects the end-user from potential electric shocks.

The cover substrate according to the disclosure provides a facility for attaching to an external object, thereby enabling an extremely flexible, cost-effective and compact sensor system. This measure enables standard production of the sensor device, which, for instance, is in the form of a multichip sensor, because the attachment facility for the target application is not defined until the particular separately made cover device is selected, which again further reduces costs of the whole system.

The sensor system can be an energy-autonomous sensor that can communicate wirelessly with other devices, for instance in a network. The sensor device may be an acceleration sensor, for example for detecting the window position on the window frame, and/or a moisture sensor, for example for detecting mildew behind a cupboard.

An electrical test contact in the sense of the disclosure is understood to mean an electrical contact by means of which it is possible to test the functionality of the sensor system or the sensor device during, or on completion of, the production process of the sensor device. The sensor device may here be a ready-to-use, tested and, if applicable, delivered sensor.

In addition, known integrated circuit packaging techniques can preferably be used to connect the cover device mechanically to the sensor device in a cost-effective and compact way. As a field of microelectronics and microsystem engineering, integrated circuit packaging includes all the technologies and design tools that are needed to assemble microelectronic components. The bonding techniques used in integrated circuit packaging include, for example, wire-bonding techniques, TAB (Tape Automated Bonding), flip-chip technology, adhesive bonding, anodic bonding, solder techniques, reflow soldering methods (SMT, Surface Mount Technology) and wave-soldering processes. The assembly techniques used in integrated circuit packaging include, for instance, film technologies, thin-film technologies, techniques for modifying, patterning and removing film layers, laser processes and dicing.

It is advantageous if the cover device has an internal surface which faces the external surface comprising the at least one test contact, and on which internal surface is arranged at least one first metallization, wherein the first metallization is mechanically connected to at least one of the electrical test contacts. The first metallization can here be configured in the form of a "dummy pad" as a solder bump or formed by conductive adhesive. This measure offers a simple facility for fixing the cover substrate to the sensor device. In addition, the metallization can also be disconnected as the last electrical connection, e.g. for the purpose of making contact with a dual-sided solar cell in order to close the circuit for the sensor system thereby. Furthermore, the metallization can extend into the inside of the cover substrate and be configured in the form of a functional electrical conductor loop, for example as an antenna pattern. The antenna pattern can here be arranged mainly inside the cover substrate and connected to the sensor device only via a relatively small portion arranged on the internal surface of the cover substrate, in order to further reduce the complexity of the sensor system.

In addition, it is advantageous if in addition at least one electrical connecting contact is arranged on the external surface comprising the at least one test contact, and if the cover device is configured such that electrical contact can be made to at least one of the electrical connecting contacts from outside the sensor system. In this case, the connecting contacts are obviously not test contacts, and therefore it is not possible to use the connecting contacts to perform a functionality test. The cover device can advantageously comprise at least one first opening and/or at least one via that is electrically connected to at least one of the electrical connecting contacts, in order to enable electrical contact to be made from outside the sensor system. This measure makes it possible to provide electrically conducting access paths to which contact can be made from outside the sensor system, which access paths are essential, for instance, in order to charge a battery or to provide an interface for system updates.

It is also advantageous if the sensor device comprises a sensor substrate which forms the external surface comprising at least one test contact, and if the cover device comprises a cover substrate comprising a first segment that corresponds to the external surface, wherein the first segment of the cover device and the external surface, which comprises the at least one test contact, are connected together at least partially. In this case, a sensor and/or ASIC can be arranged on a substrate comprising metallizations, and can be screened from the environment e.g. by encapsulation or a cap (made of metal or plastic), so that test contacts are arranged only on the substrate external face. The cover substrate can be fabricated, for example, also by means of printed circuit board technology, e.g. from standard materials such as FR4, high Tg FR4 or BT. This can provide a compact, easy-to-make sensor system.

Moreover, it is advantageous if the cover device comprises a second segment which bounds the first segment and at least partially encloses the sensor device at right angles to the external surface. By means of this measure, the cover device provides lateral protection of the sensor system.

In addition, it is advantageous if the sensor device and/or the cover device comprise an energy storage unit and/or an energy converter unit, which can be used to supply the sensor device with power. An extremely compact sensor having an in-built power supply can be realized in this way.

It is also advantageous if the energy converter unit comprises a photovoltaic cell and/or a thermoelectric generator, and the cover device comprises at least one corresponding second opening in order to allow the entry of light rays or heat. This measure enables versatile use of the sensor system, and allows the sensor system to use the light energy or thermal energy from its surroundings to generate power.

In addition, it is advantageous if a transparent protective layer and/or a thermally conductive material is introduced at least partially in the second opening. The cover device can here be arranged as a square frame having an opening positioned in the center. In the case of a photovoltaic cell, a transparent protective layer can be applied inside the second opening, which protects the photovoltaic cell from mechanical effects (impacts, scratches) and also from environmental influences (moisture). The protective layer can here be in the form of small glass panels, a film or gel, and can be applied by gluing, blade coating or printing. In the case of a thermoelectric generator, a thermally conductive material can be introduced in the second opening in order to increase the efficiency of the thermoelectric generator. In addition, thermal structures can be provided in order to dissipate the heat from the thermoelectric generator, because the efficiency of a thermoelectric generator depends on the temperature difference between the upper face and the lower face.

It is also advantageous if the sensor device and/or the cover device comprise an integrated circuit, in particular a wireless communications unit for data transmission. This measure enables the sensor system to communicate with other devices, in particular in a network, e.g. via the Internet, and to transmit data, in particular sensor data, to these devices.

In addition, it is advantageous if the sensor device comprises at least one access aperture, and the cover device comprises at least one third opening that corresponds to the access aperture. This measure makes it possible to enable the entry of fluids and/or radiation and/or sound into the sensor device and hence to configure the sensor system, for example, as a moisture sensor, gas sensor and/or acoustic sensor.

In addition, it is particularly advantageous if the cover device and/or the sensor device comprise at least one fastening means in order to enable the sensor system to be fitted to another object. The fastening means may then be in the form of a suction pad, adhesive surface, hook-and-loop fastener, electrostatic pad or magnet. Different attachment facilities are thereby provided according to the application, for instance for attaching to windows, radiators, wallpaper, tiles, wooden objects etc. For example, (micro)pads are useful for smooth surfaces such as windows, tiles or radiators, whereas (micro)pins can be used for attaching to wallpaper (mildew detection). Adhesive surfaces are another alternative here for attaching to surfaces, as are magnets, which allow attachment combined with easy means of repositioning, if required, on metal surfaces such as radiators, metal lamps or metal window frames. An electrostatic pad is also possible for particularly small sensor systems. As explained above, the provision according to the disclosure of attachment means on the cover substrate enables an extremely versatile, cost-effective and compact sensor system. This measure allows standard production of the sensor device, for instance in the form of a multichip sensor, because the attachment facility for the target application is not defined until the particular separately made cover device is selected.

It shall be understood that the abovementioned features and the features still to be described below can be used not just in the stated combinations but also in other combinations or in isolation without departing from the scope of the present disclosure.

BRIEF DESCRIPTION OF THE DRAWINGS

The disclosure is described and explained in greater detail below with reference to some selected exemplary embodiments in conjunction with the enclosed drawings, in which:

FIGS. 2a to 2c show an exemplary embodiment of the sensor system according to the disclosure;

FIGS. 4a to 4c show a further exemplary embodiment according to the disclosure comprising an opening;

FIGS. 9a and 9b show a further exemplary embodiment according to the disclosure comprising an access aperture;

DETAILED DESCRIPTION

Figure 1A:
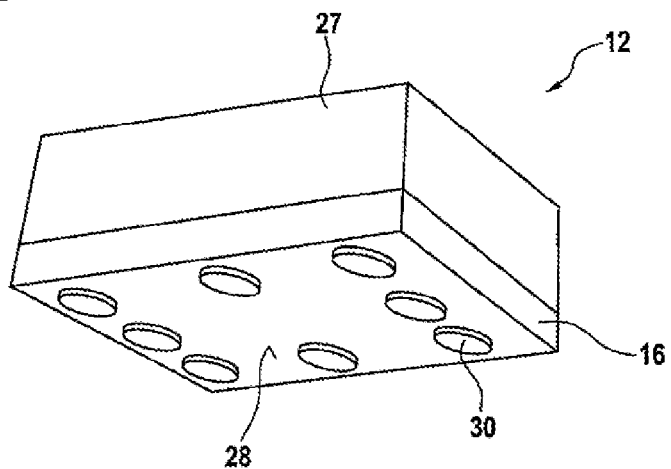
FIGS. 1a and 1b show a schematic diagram of a sensor device of the sensor system according to the disclosure without cover device fitted.
Figure 1B:
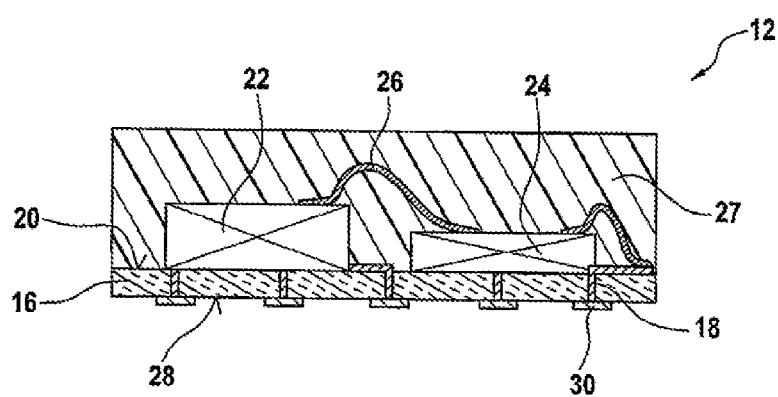

To improve understanding, FIGS. 1a and 1b show a sensor device 12 of the sensor system 10 according to the disclosure without a cover device fitted. The sensor device 12 comprises a sensor substrate 16 having an internal surface 20 and an external surface 28. A sensor 22 is arranged on the internal face 20 of the sensor substrate 16. The sensor 22 can here comprise a sensor element, for example in the form of a temperature sensor, load cell or acceleration sensor. In addition, an energy storage unit 24 is arranged on the internal face 20. The energy storage unit 24 is connected to the sensor 22 via a bond wire 26. A wireless communications unit 46 can be provided instead of, or in addition to, the energy storage unit 24, as is described in greater detail below.

An encapsulation compound 27 is disposed on the internal surface 20 of the sensor substrate and encapsulates the sensor 22, the bond wire 26 and the energy storage unit 24, which can be in the form of a battery for example. The encapsulation compound 27 also encapsulates the exposed areas of the internal surface 20 of the sensor substrate 16. A thickness of the layer of the encapsulation compound 27 can be chosen such that the components 22, 24 are completely enclosed by the encapsulation compound 27. Depending on the embodiment, the encapsulation compound 27 can be in the form of a potting compound or a molding compound or even a cap, for instance made of metal or plastic. The encapsulation compound 27 provides a simple way of forming a package for the components 22, 24 or for the sensor device 12.

Test contacts 30 are arranged on the external face 28 of the sensor device 12, which external face is formed by the sensor substrate 16. In this case, the test contacts 30 are electrically connected via metallizations 18 to the components, i.e. the sensor 22 and the battery 24, that are arranged on the interior surface 20 of the sensor substrate 16. As mentioned in the introductory part, the test contacts 30 are used to test the functionality of the sensor device 12 before finishing the sensor system, i.e. before the test contacts 30 are covered by the cover device according to the disclosure that is described below.

Figure 2B:
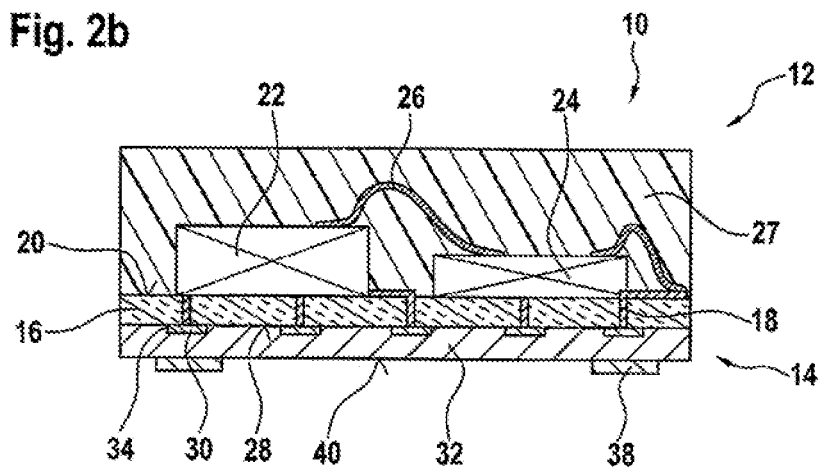
Figure 2C:
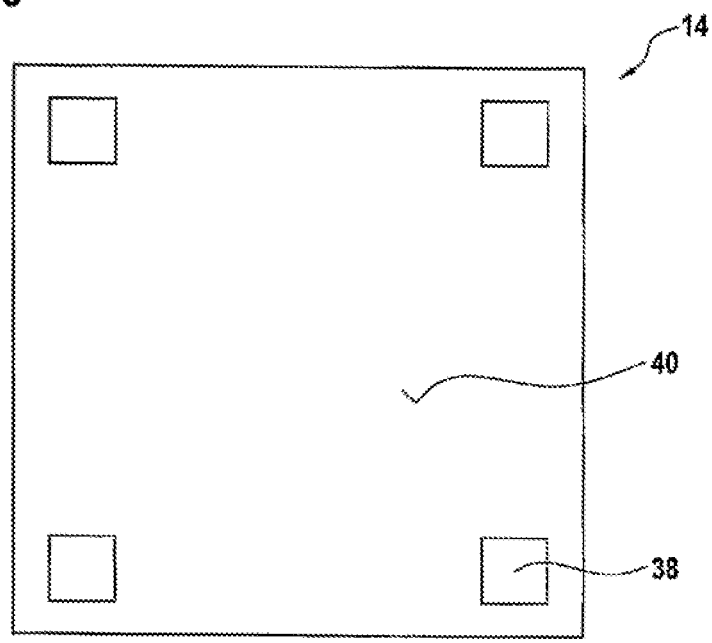

A first exemplary embodiment of a sensor system according to the disclosure is shown in FIGS. 2a to 2c and is denoted in its entirety by the reference number 10. The sensor system 10 here comprises the sensor device 12 shown in FIGS. 1a and 1b, and a cover device 14 according to the disclosure. FIG. 2a shows an arrangement in which the sensor device 12 and the cover device 14 are not yet connected together, i.e. before the step of connecting the cover device 14 to the sensor device 12.

In the embodiment shown, the cover device 14 comprises a cover substrate 32. The cover substrate 32 can be made here using printed circuit board technology, where standard materials such as FR4, high Tg FR4 or BT, for example, can be used. It should be mentioned, however, that pre-mold packages, molded interconnected devices (MID) or liquid-crystal polymers (LCP) can also be used for the cover device 14. The cover substrate 32 further comprises contact receptacles 34. The contact receptacles 34 are arranged on an internal surface 36 of the cover device 14, or more specifically of the cover substrate 32. In addition, the cover device comprises fastening means 38. The fastening means 38 are arranged on an external surface 40 of the cover device 14, or more specifically of the cover substrate 32. It should be pointed out here that the fastening means 38 are not essential to the sensor system 10 according to the disclosure.

FIG. 2b shows the sensor system 10 according to the disclosure in the assembled state, i.e. after testing the sensor device 12 and connecting the cover device 14 to the sensor device 12. The cover device 14 is here mechanically connected to the sensor device 12 preferably using known integrated circuit packaging techniques. In particular, the external surface 28 of the sensor device 12 is connected to the internal surface 36 of the cover device 14 in the process. As FIG. 2b also shows, the contact receptacles 34 are used to accommodate the test contacts 30 in order to ensure better positioning of the cover device 14 on the sensor device 12.

FIG. 2c shows the external surface 40 of the cover device 14, or more specifically of the cover substrate 32, comprising four fastening means 38. The cover device 14 here has a square shape.

Figure 3A:
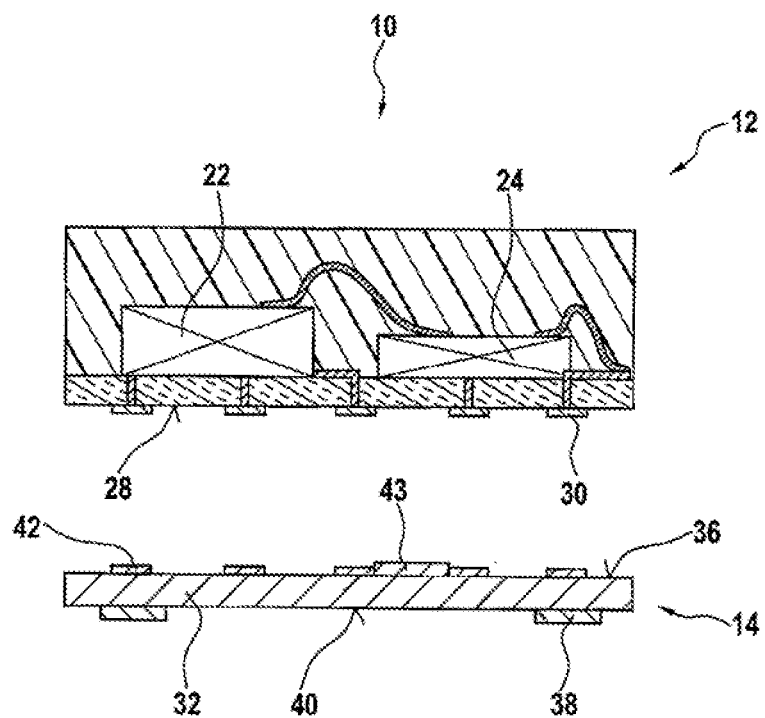
FIGS. 3a to 3c show a second exemplary embodiment of the sensor system according to the disclosure comprising a metallization.
Figure 3B:
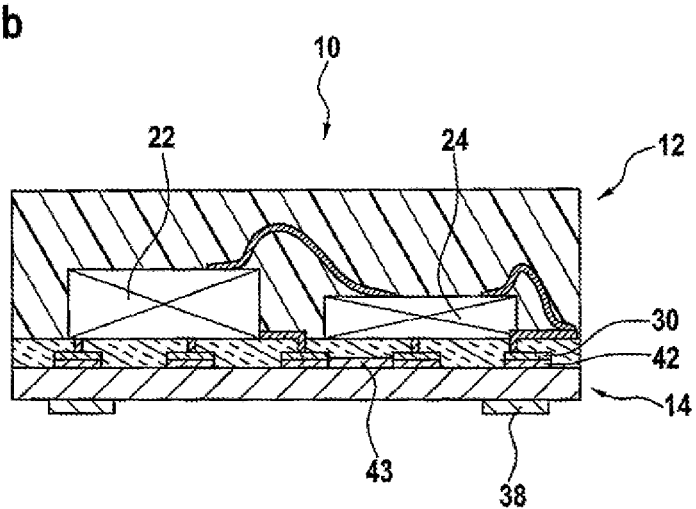
Figure 3C:
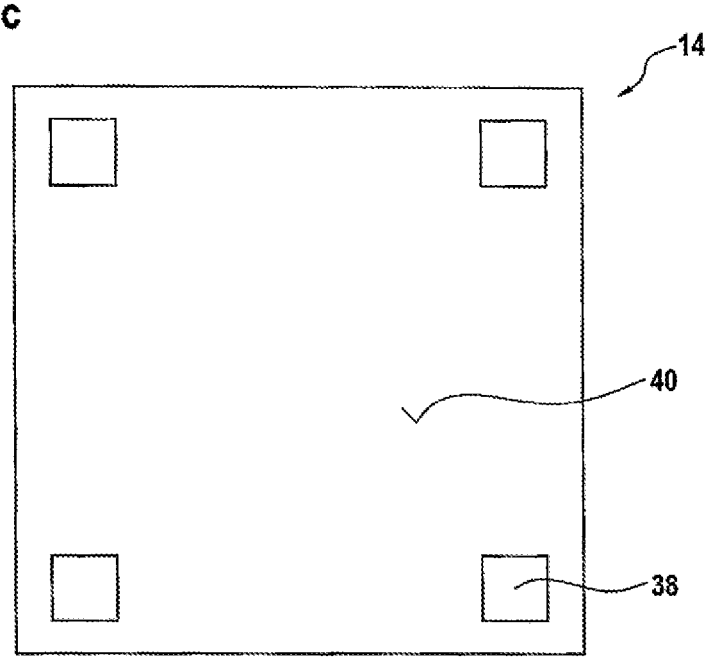

FIGS. 3a to 3c show a further exemplary embodiment of the sensor system 10 according to the disclosure, in which first metallizations 42 are provided instead of the contact receptacles 34. As FIG. 3b shows, the first metallizations 42 are connected to the test contacts 30 after finishing the sensor system 10. Thus the first metallizations 42, in the form of "dummy pads", act as solder bumps for connecting the cover substrate 14 to the sensor device 12. In addition, the first metallization 42 can also be configured as one or more electrical connections 43, which close the circuit for the sensor devices 12 when the cover substrate 14 is connected to the sensor device 12, in other words the test contacts 30 are connected to the first metallizations 42. The first metallization 42 can also be configured as a functional electrical line or conductor loop, for example as an antenna pattern or as EMC protection. In this case, the metallization 42 can extend into the interior of the cover substrate 32. The antenna pattern can be arranged largely inside the cover substrate 32 and connected to the sensor device 12 only via a relatively small portion arranged on the internal surface 36 of the cover substrate 36.

Figure 4A:
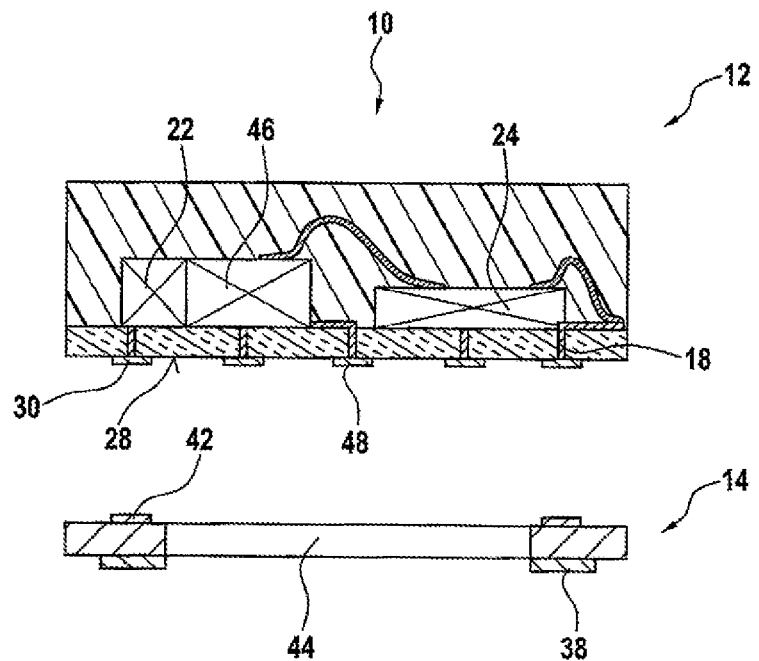

FIGS. 4a to 4c show a further embodiment of the sensor system 10 according to the disclosure. Unlike the exemplary embodiments described above, the sensor device 12 comprises connecting contacts 48. Like the test contacts 30, the connecting contacts 48 are arranged on the external surface 28 of the sensor device 12, or more specifically of the sensor substrate 16. The connecting contacts 48 are connected via metallizations 18 to the energy storage unit 24 and an additionally provided wireless communications unit 46. The wireless communications unit 46 is arranged on the interior surface 20 of the sensor substrate 16 and electrically connected to the sensor 22 and the energy storage unit 24. Since, unlike the test contacts 30, the connecting contacts 48 can be accessible from outside the sensor system 10, the cover device 12 comprises a first opening 44. The first opening 44 thereby enables an electrically conducting access path to the connecting contacts 48, for example in order to charge the energy storage unit 24 or to provide an interface for updates for the wireless communications unit 46.

FIG. 4c shows a view from below of the sensor device 10, from which it is clear that the cover device 12 is in the form of a square frame.

Figure 5A:
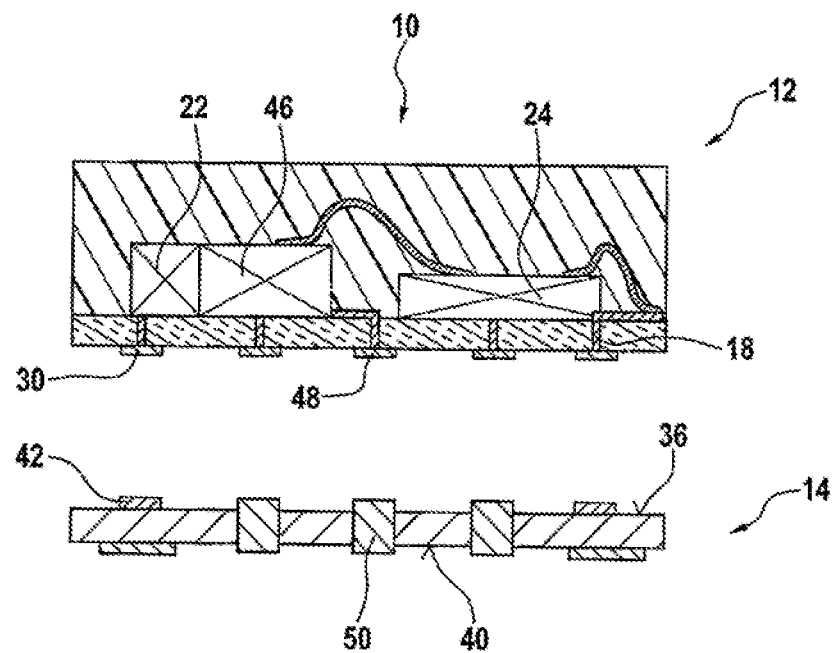
FIGS. 5a to 5c show a further exemplary embodiment according to the disclosure comprising vias.
Figure 5B:
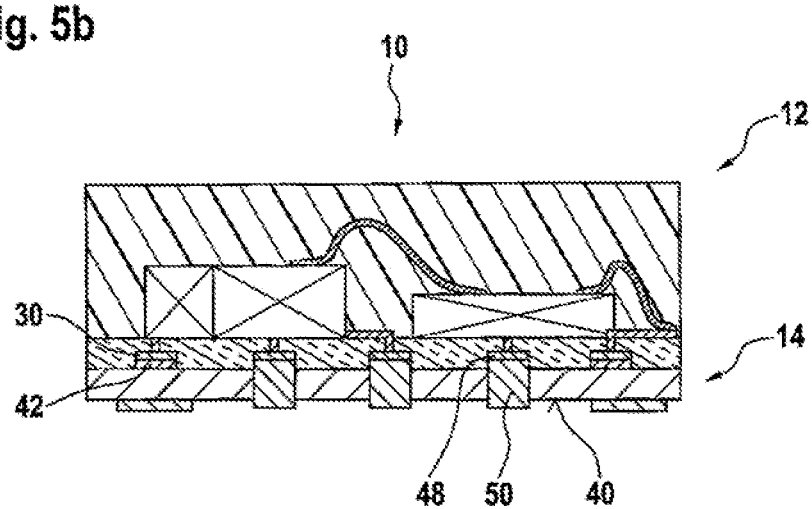
Figure 5C:
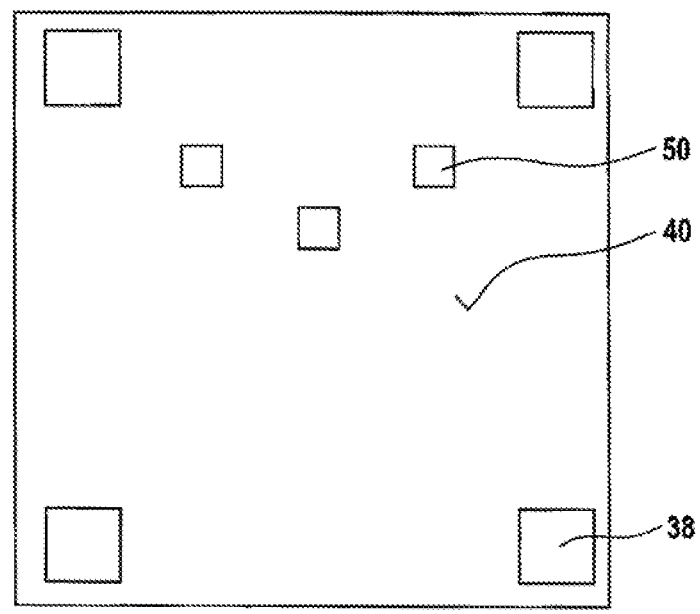

Similar to the exemplary embodiment shown in FIGS. 4a to 4c, the exemplary embodiment shown in FIGS. 5a to 5c of the sensor system 10 according to the disclosure comprises vias 50 instead of the first opening 44, which extend from the interior surface 36 of the cover device 14 to the external surface 40 of the cover device 14 and are electrically and mechanically connected to the connecting contacts 48. This measure likewise enables electrical contact to be made to the connecting contacts 48 from outside the sensor system 10.

Figure 6A:
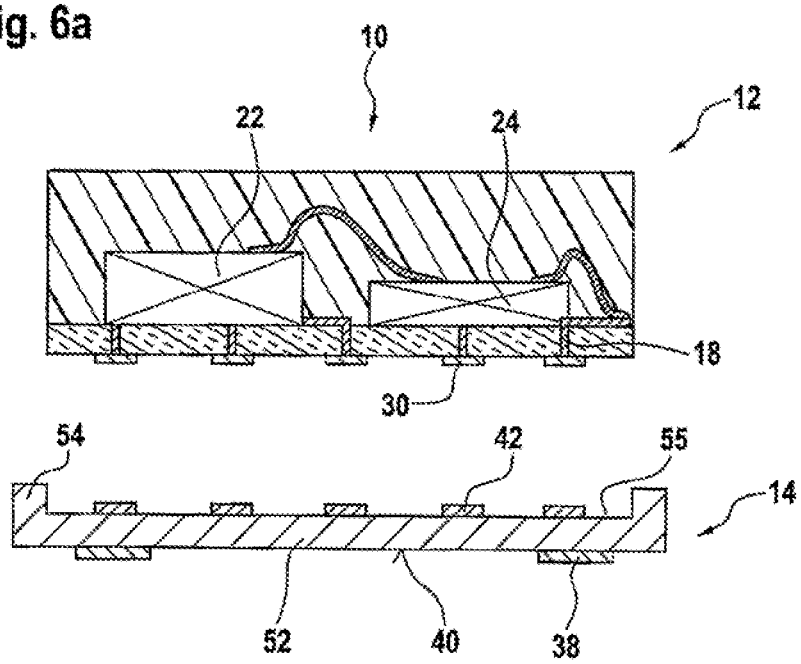
FIGS. 6a and 6b show a further exemplary embodiment according to the disclosure comprising lateral protection.
Figure 6B:
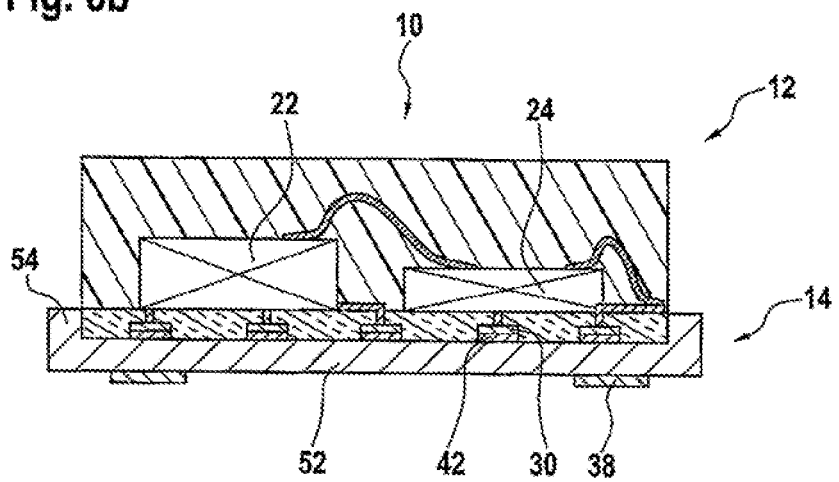

FIGS. 6a and 6b show the exemplary embodiment of FIGS. 3a to 3c with additional lateral protection provided for the sensor system 10. In this case, the cover device 14 comprises a first segment 52, which forms the interior surface 36 of the cover device 14 and is connected to the external surface 28, or more specifically to the test contacts 30 on the external surface 28. On the sides of the sensor device 12, the cover device 14 additionally comprises a second segment 54. The second segment 54 is arranged such that it bounds the first segment 52 and is in the form of a lateral lip. This forms a sensor device receptacle 55 that is configured to fit the external surface 28 of the sensor device 12. As FIG. 6b shows, the sensor device 12 is arranged in the sensor device receptacle 55 and is hence mechanically protected by the segment 54, which preferably completely encloses the sides of the sensor device 12.

Figure 7A:
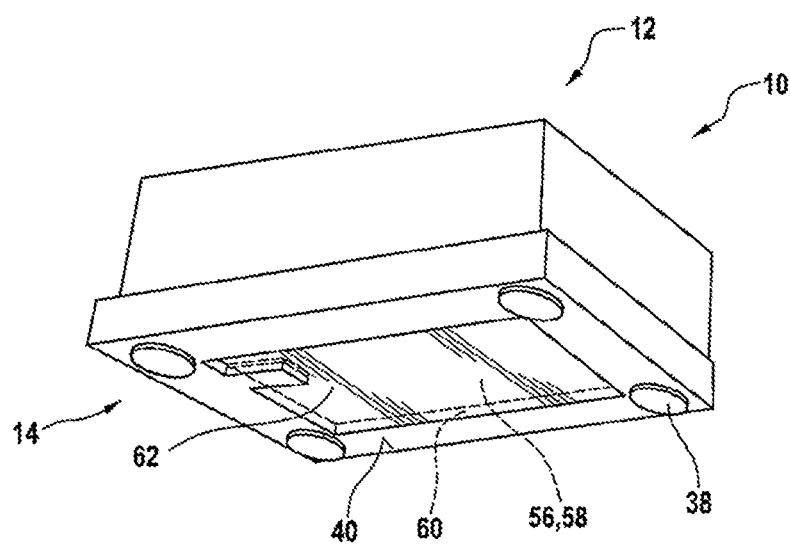
FIGS. 7a to 7c show a further exemplary embodiment according to the disclosure comprising a photovoltaic cell.
Figure 7B:
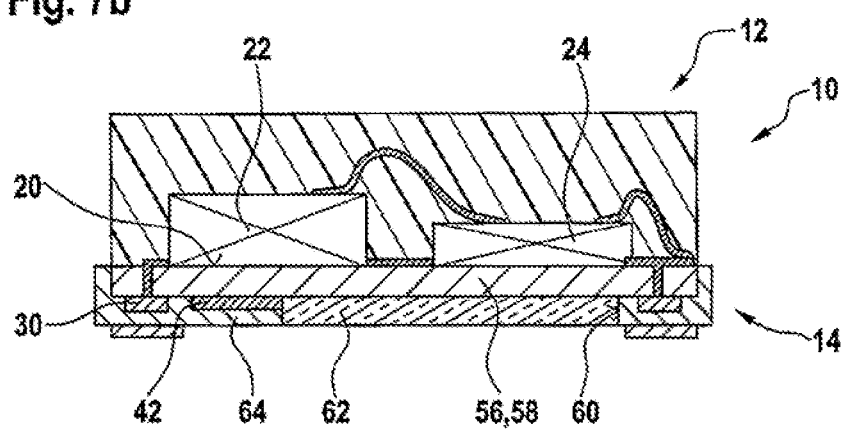
Figure 7C:
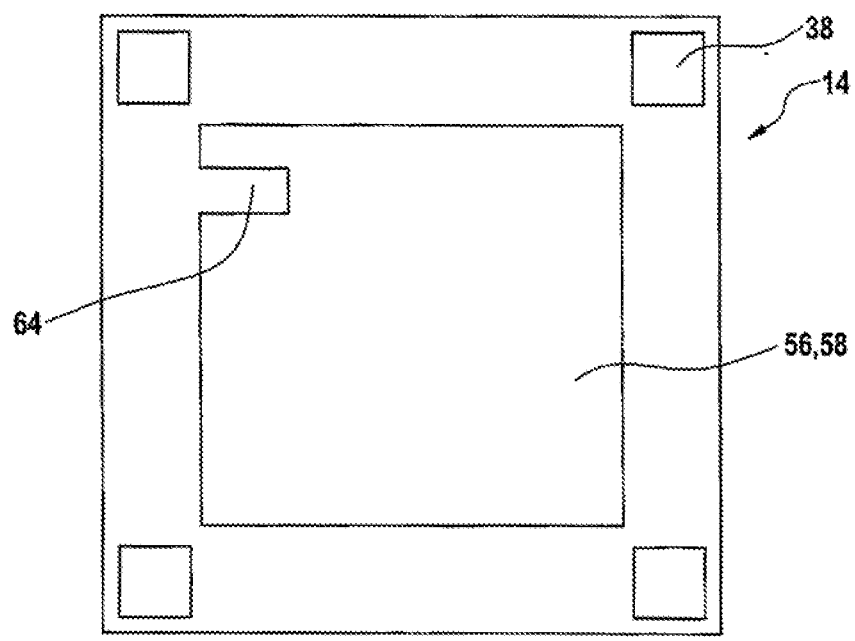

FIGS. 7a to 7c show a further exemplary embodiment according to the disclosure of the sensor system 10, which is configured to be energy autonomous, i.e. comprises an in-built power supply. In this case, the sensor system 10 comprises an energy conversion unit 56 in the form of a photovoltaic cell 58. The photovoltaic cell 58 here replaces the sensor substrate 16 of the exemplary embodiments described above, so that a more compact system configuration can be achieved. Thus the external surface 28 comprising the test contacts 30 of the sensor device 12 is formed by the photovoltaic cell 58. As FIG. 7b shows, the sensor 22 and the energy storage unit 24 are arranged on the internal surface 20 of the photovoltaic cell 58. As can also be seen from the figure, the cover device 14, or more specifically the cover substrate 32, comprises a second opening 60. The opening 60 is used here to allow the passage of light rays onto the photovoltaic cell 58. In addition, a protective layer 62 is provided in the opening 60 in order to protect the photovoltaic cell 58. Since this specific exemplary embodiment relates to a photovoltaic cell having dual-sided contacts, the cover device 14 comprises a projection 64, which extends into the second opening 60. On the side of the projection 64 that faces the photovoltaic cell 58 is additionally provided a further metallization 42, which ensures that contact is made with the photovoltaic cell 58 on its photovoltaically active front face and thereby closes the circuit of the sensor device 12.

Figure 8A:
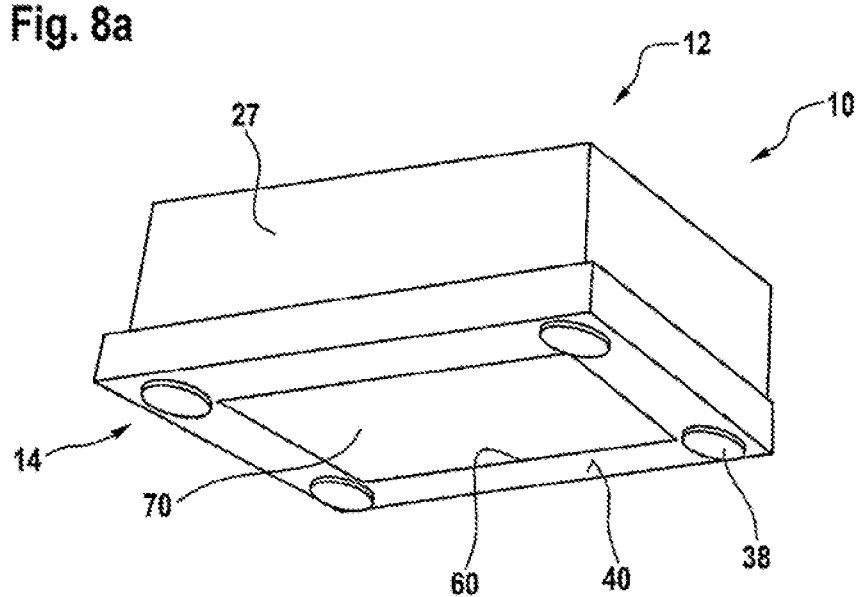
FIGS. 8a and 8b show a further exemplary embodiment according to the disclosure comprising a thermoelectric generator.
Figure 8B:
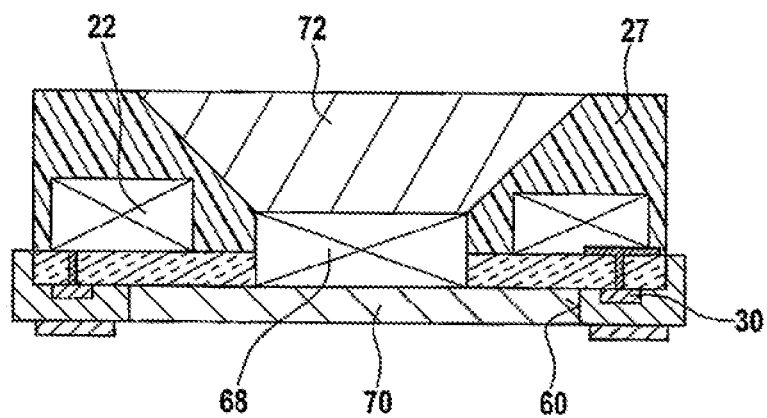

FIGS. 8a and 8b show a further exemplary embodiment of an energy-autonomous sensor system 10, wherein the power supply is provided by a thermoelectric generator 68. In order to increase the efficiency of the thermoelectric generator 68, in place of the protective layer 62 shown in FIGS. 7a to 7c, a thermally conductive material 70 is arranged in the second opening 60. In addition, the sensor device 12 comprises a cooling structure 72, which is arranged in the encapsulation compound 27 and ensures efficient cooling of the thermoelectric generator 68. It should be mentioned here, however, that the thermally conductive material 70 can also be arranged in the encapsulation compound 27 and conversely the cooling structure 72 can be provided in the cover device 14 without departing from the scope of the present disclosure.

FIGS. 9a and 9b show a further exemplary embodiment according to the disclosure of the sensor system 10, which can be configured in particular as a moisture sensor, gas sensor and/or acoustic sensor. In order to enable the entry of fluids, radiation and/or sound into the sensor device, a case 74 is provided instead of the encapsulation compound 27. The case 74 has an internal space 75 in which the sensor 22 is arranged. In order to ensure access into the internal space 75 and hence to the sensor 22, an access aperture 76 is provided in the sensor device and an opening 78 that corresponds thereto is provided in the cover device 14. Hence fluids, radiation and/or sound from the surroundings can enter the internal space 75 through the third opening 78 of the cover device 14 and through the access aperture 76 of the sensor device 12, and can be detected by the sensor 22.

Figure 10A:
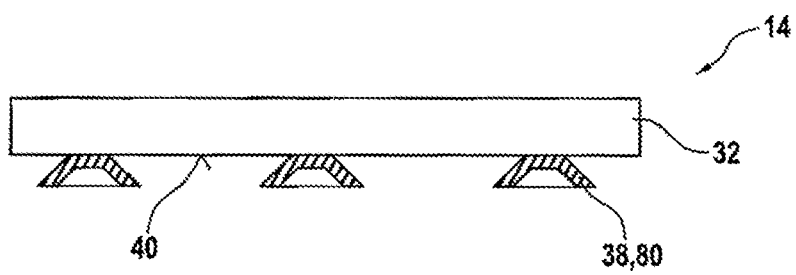
FIGS. 10a to 10d show exemplary embodiments of the cover device according to the disclosure comprising fastening means.
Figure 10B:
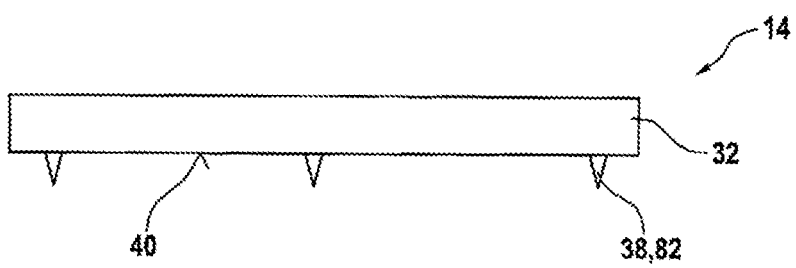
Figure 10C:
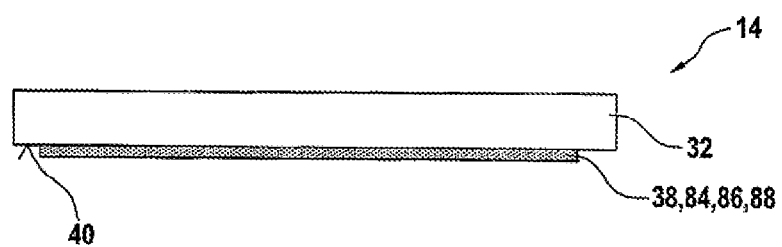
Figure 10D:
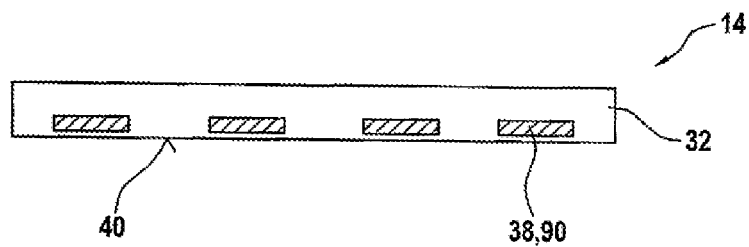

Finally, FIGS. 10a to 10d show different exemplary embodiments of the cover device 14 according to the disclosure having different fastening means 38. The cover device 14 shown in FIG. 10a comprises on the external surface 40 thereof fastening means 38 in the form of suction pads 80. These can obviously also be in the form of micro suction-pads. Such an embodiment of the fastening means 38 is particularly useful for smooth surfaces such as windows, tiles or radiators. In FIG. 10b, the fastening means 38 are in the form of pins or micro-pins 38. FIG. 10c shows a further embodiment of the fastening means 38. In this case, the fastening means 38 are in the form of an adhesive surface 84, hook-and-loop fastener 86 or electrostatic pad 88. The latter embodiment is particularly advantageous for very small sensor systems 10. In FIG. 10d, the fastening means 38 are in the form of magnets 90. Unlike the fastening means described above, the magnets 90 are not arranged on the external surface 40 of the cover device 14 but integrated inside the cover device 14, or more specifically inside the cover substrate 32. By means of this embodiment of the cover device 14, the sensor system 10 can be attached and, if applicable, repositioned, extremely easily on metallic surfaces such as radiators, metal lamps or metal window frames.

The exemplary embodiments described and illustrated in the figures are only chosen by way of example. Different exemplary embodiments can be combined with one another either in full or by individual features. Furthermore, features of one exemplary embodiment can be added to another exemplary embodiment. In addition, method steps according to the disclosure can be repeated and can be executed in a different order from that described. If an exemplary embodiment comprises an "and/or" conjunction between a first feature and a second feature, then this shall be interpreted to mean that the exemplary embodiment according to one embodiment includes both the first feature and the second feature, and according to another embodiment comprises either just the first feature or just the second feature.

What is claimed is:

1. A sensor system, comprising:
 a sensor device including:
  a substrate having an inner surface, and
  a sensor supported by the inner surface, the sensor device having an external surface defined by the substrate on which is arranged at least one electrical test contact; and
 a cover device including at least partially an electrically insulating material, the cover device mechanically connected to the sensor device;
 wherein the cover device is configured to cover the at least one electrical test contact of the sensor device so as to prevent electrical contact from being made to the at least one electrical test contact from outside the sensor system.

2. The sensor system according to claim 1, wherein:
 the cover device has an internal surface configured to face the external surface; and
 at least one further metallization is arranged on the internal surface, the at least one further metallization mechanically connected to the at least one electrical test contact.

3. The sensor system according to claim 1, further comprising:
 at least one electrical connecting contact arranged on the external surface,
 wherein the cover device is configured to enable electrical contact to be made to the at least one electrical connecting contact from outside the sensor system.

4. The sensor system according to claim 3, wherein the cover device includes at least one of at least one first opening and at least one via electrically connected to the at least one electrical connecting contact to enable electrical contact to be made from outside the sensor system.

5. The sensor system according to claim 1, wherein:
the cover device includes a cover substrate having a first segment corresponding to the external surface, and
the first segment of the cover device and the external surface are connected together at least partially.

6. The sensor system according to claim 5, wherein the cover device includes a second segment configured to bound the first segment and at least partially enclose the sensor device at right angles to the external surface.

7. The sensor system according to claim 1, wherein:
at least one of the sensor device and the cover device includes at least one of an energy storage unit and an energy converter unit, and
the at least one of the energy storage unit and the energy converter unit is configured to be used to supply the sensor device with power.

8. The sensor system according to claim 7, wherein:
the energy converter unit includes at least one of a photovoltaic cell and a thermoelectric generator; and
the cover device includes at least one corresponding second opening.

9. The sensor system according to claim 8, further comprising at least one of a transparent protective layer and a thermally conductive material introduced at least partially in the second opening.

10. The sensor system according to claim 1, wherein at least one of the sensor device and the cover device includes an integrated circuit.

11. The sensor system according to claim 1, wherein:
the sensor device includes at least one access aperture; and
the cover device includes at least one third opening aligned with the at least one access aperture.

12. The sensor system according to claim 1, wherein at least one of the cover device and the sensor device includes at least one fastening mechanism configured to enable the sensor system to be fitted to another object.

13. The sensor system according to claim 12, wherein the at least one fastening mechanism is formed as one of a suction pad, a pin, an adhesive surface, a hook-and-loop fastener, an electrostatic pad and a magnet.

14. A cover device for a sensor system, the sensor system including a sensor device having a sensor supported by an inner surface of a sensor substrate and having an external surface, defined by the sensor substrate, on which at least one electrical test contact is arranged, the cover device comprising:
an at least partially electrically insulating material;
at least one fastening mechanism configured to enable the sensor system to be fitted to another object; and
an internal surface configured to make a mechanical connection with the external surface of the sensor device such that the cover device covers the at least one electrical test contact of the sensor device to prevent electrical contact from being made to the at least one electrical test contact from outside the sensor system.

15. The cover device according to claim 14, wherein the at least one fastening mechanism is formed as one of a suction pad, a pin, an adhesive surface, a hook-and-loop fastener, an electrostatic pad, and a magnet.

16. The sensor system according to claim 10, wherein the integrated circuit is a wireless communications unit for data transmission.

* * * * *